United States Patent
Jackson et al.

(10) Patent No.: US 6,497,357 B2
(45) Date of Patent: Dec. 24, 2002

(54) APPARATUS AND METHOD FOR REMOVING INTERCONNECTIONS

(75) Inventors: Raymond A. Jackson, Fishkill, NY (US); Scott A. Bradley, Staatsburg, NY (US); Stephen A. DeLaurentis, Hudson, NY (US); Mario J. Interrante, New Paltz, NY (US); David C. Linnell, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/850,350

(22) Filed: May 7, 2001

(65) Prior Publication Data

US 2002/0162880 A1 Nov. 7, 2002

(51) Int. Cl.[7] .................................................. B23K 1/20
(52) U.S. Cl. ........................ 228/264; 228/13; 228/191
(58) Field of Search ............................... 228/264, 119, 228/191, 13

(56) References Cited

U.S. PATENT DOCUMENTS

| | | | |
|---|---|---|---|
| 4,327,472 A | | 5/1982 | Krzeptowski |
| 4,832,250 A | * | 5/1989 | Spigarelli et al. ........... 228/102 |
| 4,894,910 A | | 1/1990 | Reimer et al. |
| 5,553,766 A | | 9/1996 | Jackson et al. |
| 5,620,132 A | | 4/1997 | Downing et al. |
| 5,707,000 A | | 1/1998 | Olson et al. |
| 5,722,579 A | * | 3/1998 | Yu et al. ..................... 228/119 |
| 6,158,644 A | | 12/2000 | Brofman et al. |

* cited by examiner

Primary Examiner—M. Alexandra Elve
Assistant Examiner—Len Tran
(74) Attorney, Agent, or Firm—James J. Cioffi

(57) ABSTRACT

A method for removing at least one molten or solid structure from a surface including: placing the surface with the at least one molten or solid structure in a fixture; disposing said wiper assembly acted on by a bias proximate the at least one molten or solid structure; retaining the wiper assembly in a first position with a device having a first temperature point level equivalent to or higher than a second melting point level of the at least one molten or solid structure; and raising the temperature of the fixture to the first temperature point level; wherein the at least one molten or solid structure is wiped from the surface when the device reaches the first temperature point level. An apparatus for removing at least one molten or solid structure from a substrate for rework, the apparatus comprising: a fixture for sustaining and biasing the substrate against a wiper assembly; the wiper assembly configured and positioned to slidably engage at least a portion of the substrate; a bias for translating the wiper assembly along a surface of the substrate having the at least one molten or solid structure to be removed; and a guide block assembly capable of guiding and locking the wiper assembly.

15 Claims, 4 Drawing Sheets

APPARATUS AND METHOD FOR REMOVING INTERCONNECTIONS

BACKGROUND OF THE INVENTION

Ball Grid Arrays (BGA) and Column Grid Arrays (CGA) are widely used to electrically and mechanically connect substrates (typically ceramic) having semiconductor chips to a card. The BGA commonly comprises an array of metal balls that are soldered to the substrate utilizing a solder fillet material. The solder fillet material typically has a lower melting temperature (183° C. for eutectic Pb/Sn) than the solder ball (300° C.) to which it joins to, enabling the solder ball to be joined with the substrate without melting. In some instances, however, the solder ball and solder fillet material are of the same composition, thus causing the entire interconnect to become liquidous during the reflow. During the above manufacturing process to form a module, a defect may occur to one or more balls which requires the array of balls to be removed and replaced with a new array of balls.

After the module is populated with interconnects, such as a BGA, the module is typically joined to a card, often with the same solder alloy used initially to join the BGA to the substrate forming the module. Should a defect occur when joining a module to a card or later testing of the card mounted module, the module is removed from the card. When a module is removed from a card, it is necessary to remove the remaining balls and repopulate the substrate with a new array of balls if the module is to be used again.

Not only must the solder balls (or interconnects) be removed if a defect occurs during manufacturing, mounting, or testing a module, but the fillet solder that mechanically retains the interconnects in place must be dressed off in such a manner that new fillet material can be applied.

A conventional method to remove and dress BGA's from substrates is known as hot oil rework. A module is placed vertically into a chuck and lowered into a bath of oil heated to approximately 220° C. The hot oil melts the fillet material holding the balls (interconnects). A wiper blade then pushes against the substrate and wipes off the BGA's and the fillet material as the wiper is lifted out of the bath. The problems with the above method are twofold. First, the entire substrate must be subjected to the hot oil. The hot oil is detrimental to certain microelectronic components and packaging. Secondly, the use of hot oil to remove components disposed on the top surface that are joined with substantially the same solder alloys as the BGA's on the bottom surface cause the top surface components to fall off when subjected to a liquidous temperature in the hot oil bath meant only to remove the bottom surface BGA's. Furthermore, the conventional hot oil process is conducted in a batch mode, as opposed to a more desirable mode of continuously feeding a tool with individual modules needed to be reworked Therefore, the conventional hot oil process cannot ensure the effectiveness of rework, results in undesirable damage to certain microelectronic components and organic carriers, and enables top surface metallurgy components to fall off and must then be repopulated. There thus remains a need for an improved method and apparatus to remove BGA interconnects for rework from substrates and interposers.

SUMMARY OF THE INVENTION

The above-described circumstances are overcome and alleviated by the present apparatus and method for removing molten and solid material from a substrate, such as, for example solder and BGA interconnects for rework. One embodiment is a method for removing at least one molten or solid structure from a surface comprising: placing the surface with the at least one molten or solid structure in a fixture; disposing said wiper assembly acted on by a bias proximate the at least one molten or solid structure; retaining the wiper assembly in a first position with a device having a first temperature point level equivalent to or higher than a second melting point level of the at least one molten or solid structure; and raising the temperature of the fixture to the first temperature point level; wherein the at least one molten or solid structure is wiped from the surface when the device reaches the first temperature point level. Another embodiment is an apparatus for removing at least one molten or solid structure from a substrate for rework, the apparatus comprising: a fixture for sustaining and biasing the substrate against a wiper assembly; the wiper assembly configured and positioned to slidably engage at least a portion of the substrate; a heat source to raise the temperature to a melting point level of the at least one molten or solid structure; a bias for translating the wiper assembly along a surface of the substrate having the at least one molten or solid structure to be removed; and a guide block assembly capable of guiding and locking the wiper assembly.

BRIEF DESCRIPTION OF THE DRAWINGS

Referring now to the drawings wherein like elements are numbered alike in the several FIGURES.

DETAILED DESCRIPTION

This disclosure addresses a method and apparatus for removing solder from a substrate. The process basically involves the solder removal during the rework process. A prime application for this process is for the removal of the so-called dual-alloy, ball or column grid array solder joint structure. This involves melting the eutectic Sn/Pb solder which serves to attach the higher melting point balls or columns to the substrate or module. A mechanical-type wiper assembly, made from a high temperature resistant polymer and a metal blade, removes the solid balls or columns and the liquid eutectic Sn/Pb solder in one step. The advantages of this method are that the eutectic Sn/Pb solder is removed and at the same time as the liquid and solid balls or columns. Thus, the substrate or module pad are directly restored to a metallurgically planar condition which allows replacing the BGA (Ball Grid Array) or CGA (Column Grid Array) joints in a manner similar to original attachment. This is achieved by exposing the substrate or module to just one thermal exposure, reducing the opportunity for degradation and reduces cost by reducing process steps. When the module attains the correct temperature, the wiper blade is passed over at a prescribed speed and pressure. The speed is typically about 0.75 inches per second and the pressure is usually between about 200 g to about 600 g, driven by the number of interconnects to be removed. After the solder is removed, the module and new solder structures, such as, for example, BGA or CGA, are attached using the normal process.

It should be noted that the above disclosed process can also be employed on single melt alloys and elements, not just the dual melt structures described above. Additionally, although Sn/Pb is specified, the alloy or element could be of a Pb free composition, such as, but not limited to, Cu, Ag, Sn, Bi, or combinations thereof.

Figure 1:
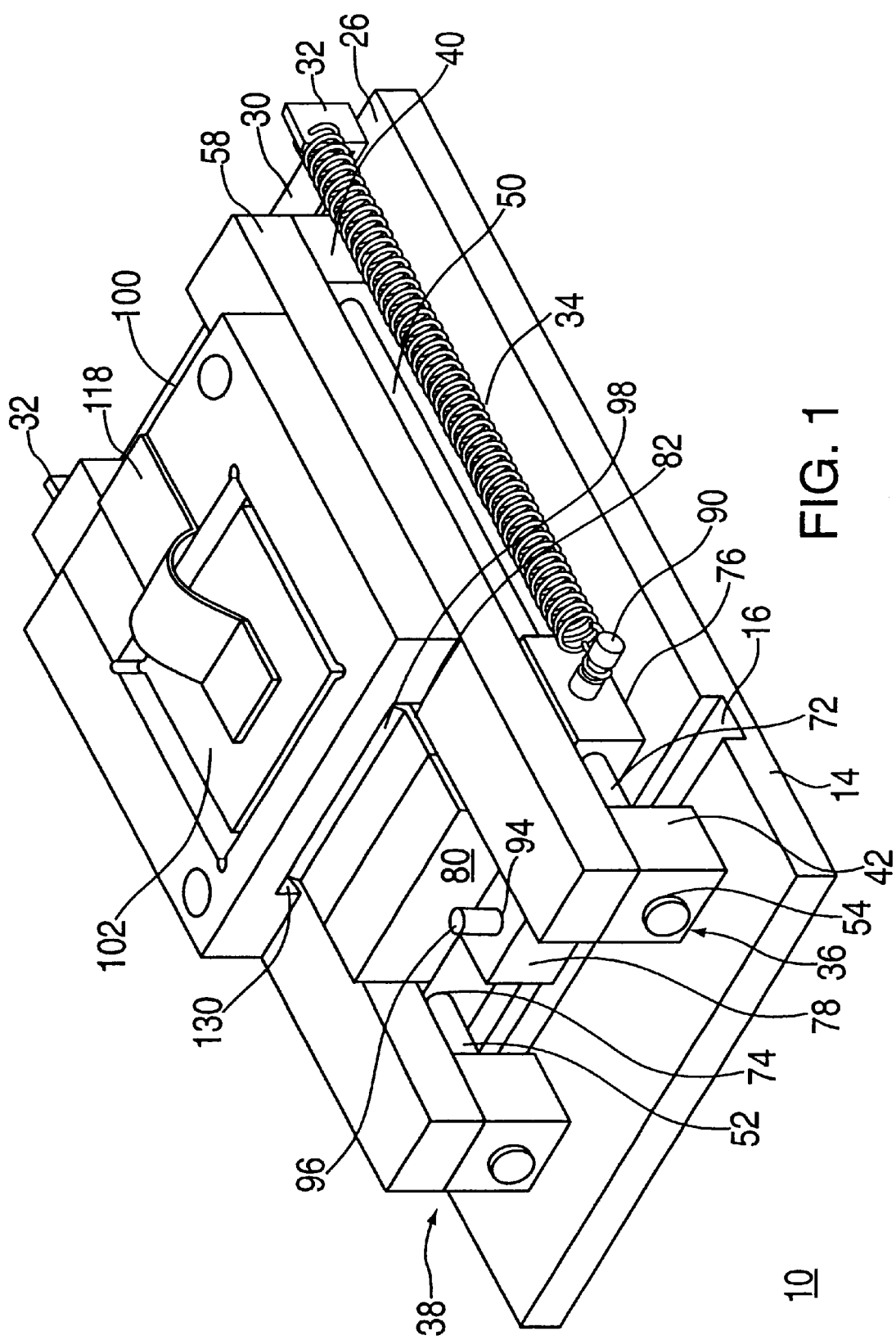
FIG. 1 illustrates an exemplary embodiment of a solder array rework tool.
Figure 2:
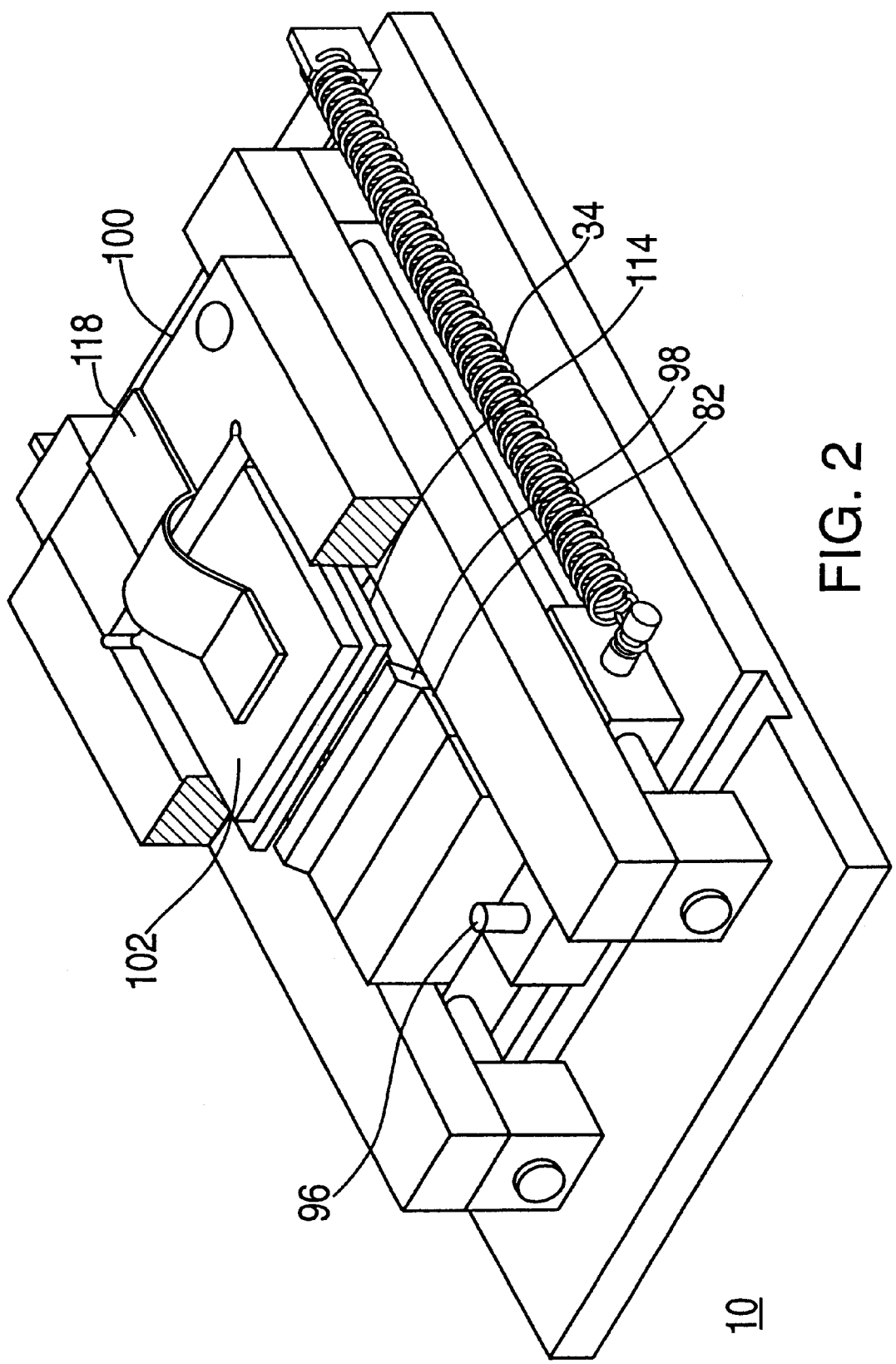
FIG. 2 illustrates the exemplary embodiment in FIG. 1 showing a sectional view an interchangeable block.
Figure 3:
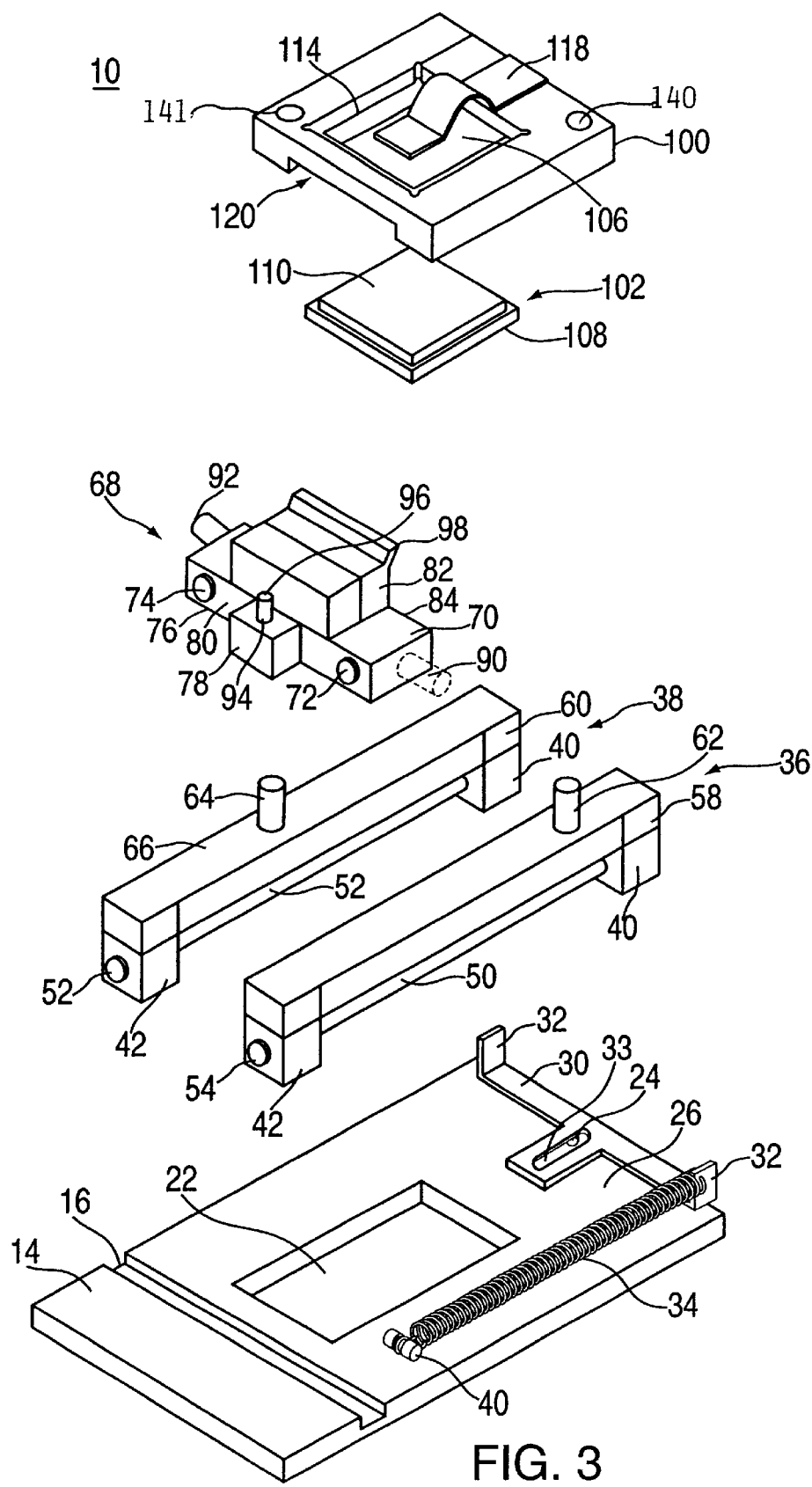
FIG. 3 is an exploded view of the exemplary embodiment shown in FIG. 1.

An exemplary embodiment of a solder array rework tool is shown generally at 10 in FIG'S. 1 and 2, while an exploded view of the exemplary embodiment of the solder ball array rework tool 10 is shown in detail in FIG. 3. The solder array removal tool 10, comprises a base 14, having a channel 16 that spans a width 18 of base 14, an aperture 22 proximate a center portion of base 14, and a spring tension adjustment 24 disposed on a surface 26 of base 14. Spring tension adjustment 24 retains a spring tensioner 30 having tabs 32. Each tab 32 includes a spring 34 depending therefrom. Tensioner 30, having movement along surface 26 limited by a slot 33 in tensioner 30, slidably engages base 14 and is held in place when adjustment 24 is tightened to clamp tensioner 30 against base 14. Aperture 22 provides an exit for any soldered interconnects removed.

Two guide assemblies 36, 38 are oriented in parallel to each other and are disposed on surface 26. Each guide assembly 36, 38 engages base 14 with two elevation blocks 40, 42 disposed at opposite ends of base 14. Intermediate elevation blocks 40, 42 are guide rails 50, 52 that are suspended by elevation blocks via openings 54 in each block 40, 42. Guide blocks 58, 60 are disposed on elevation blocks 40, 42 and are substantially the same length as rails 50, 52 and oriented in parallel with rails 50, 52. Guide blocks 58, 60 include location pins 62, 64 that are offset from each other and are perpendicularly disposed to a surface 66 of each block 58, 60.

Guide rails 50, 52 are slidably engaged with a guide block assembly 68. Guide block assembly comprises a guide rail block 70 having apertures 72, 74 that guide rails 50, 52 slidably engage. A bottom surface 76 of block 70 slidably rests on surface 26 of base 14. Guide rail block 70 is an inverted T-shaped structure having a pin retainer block 78 disposed on a first side 80 and a wiper block 82 disposed on an opposite second side 84 of guide rail block 70. Guide rail block 70 further includes two separate dowels 90, 92 disposed on either end of block 70 for attaching springs 34. Pin retainer block 78 includes an opening 94 for slidably engaging a solder alloy pin 96 that in turn engages channel 16 in base 14. Wiper block includes a wiper blade assembly 98 for removing a BGA 128 (See FIG. 4).

An interchangeable module block 100 retains a module 102 within a cavity 106 of block 100. Module 102 comprises a substrate 108 having BGA 128 depend on one side and a chip 110 on another side. Module 102 is retained in block 100 via ledges 114 that are configured on two sides within cavity 106. Ledges 114 are configured to support substrate 108 without contacting the BGA 128. A retainer clip 118 contacts the chip 110 and biases the substrate against ledges 114. Block 100 further includes locating pin holes 140, 141 that are configured, dimensioned and positioned to slidably engage locating pins 62, 64. Interchangeable module block 100 is positioned over guide blocks 58, 60 via holes 140, 141 and pins 62, 64, in this position, block 100 is retained on surface 66 of guide blocks 58, 60 restricting movement thereof Interchangeable . module block 100 includes-a cut-out 120 configured, dimensioned and positioned to allow wiper block assembly 68 access to slidably engage substrate 108 where BGA 128 is disposed.

Figure 4:
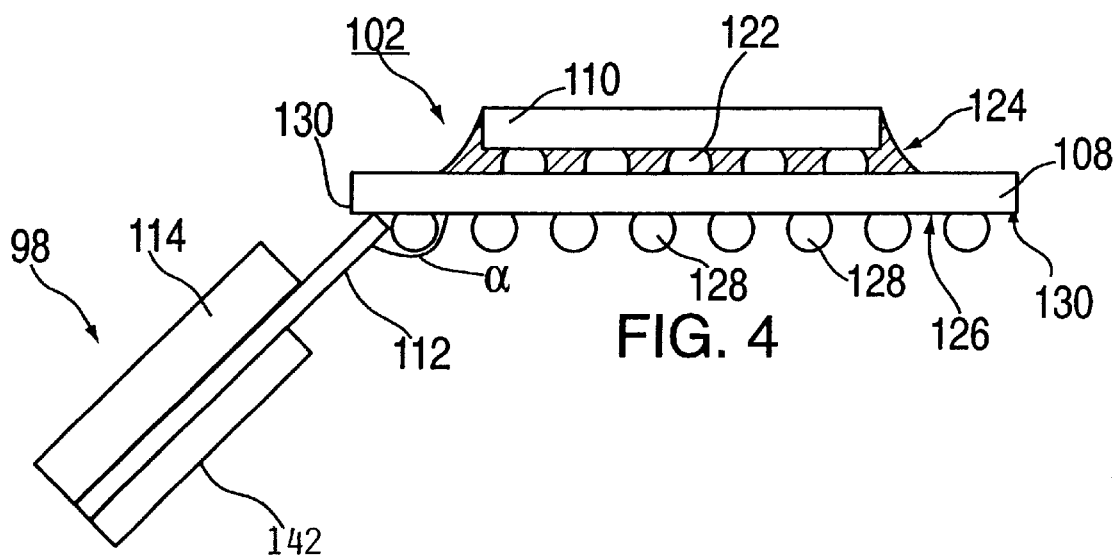
FIG. 4 illustrates a wiper blade assembly of the solder array rework tool shown in FIG. 1 in contact with a module, shown in more detail.

Referring to FIG. 4, wiper blade assembly 98 and module 102 are shown in more detail. Module 102 comprises chip 110 electrically connected to substrate (interposer) 108 via high temperature solder bumps 122 (e.g., Pb95:Sn5) and having an urderfill resin 124 intermediate chip 110 and substrate 108. On a bottom surface 126 of substrate 108 are eutectic solder balls (BGA) 128 (e.g. Pb37:Sn63). Wiper blade assembly 98 comprises a clamp plate 142 that depends from wiper block 82. A blade 112, intermediate clamp plate 142 and a high temperature polymer squeegee 114, contacts bottom surface 126 at an angle for removing BGA 128 when activated. Blade 112 is approximately 0.010 inch thick and comprises a conformable metal such as copper or stainless steel. Squeegee 114 trails blade 112 to cleanly wipe molten fillet material from surface 126 during the rework the process discussed more fully below.

Referring to FIG's 2, 4 and 5, the operation of tool 10 will be described. Substrate 108 having at least one electrical connection 128, such as, for example, solder ball or column 128, with at least one lower-melting solder layer or fillet material 134 (See FIG. 5), is retained in interchangeable module block 100 supporting two edges of bottom surface 126 with ledges 114. Ledges 114 extend approximately 0.010 inch as BGA 128 extends nearly to all edges 130 of substrate 108. It will be appreciated that ledges 114 do not extend further in order to allow passage of wiper block assembly 98. Substrate 108 is biased against ledges 114 by retainer clip 118 that presses against chip 110. Block 100 is positioned and secured to guide rail blocks 58, 60 via locating pins 62, 64.

Figure 5:
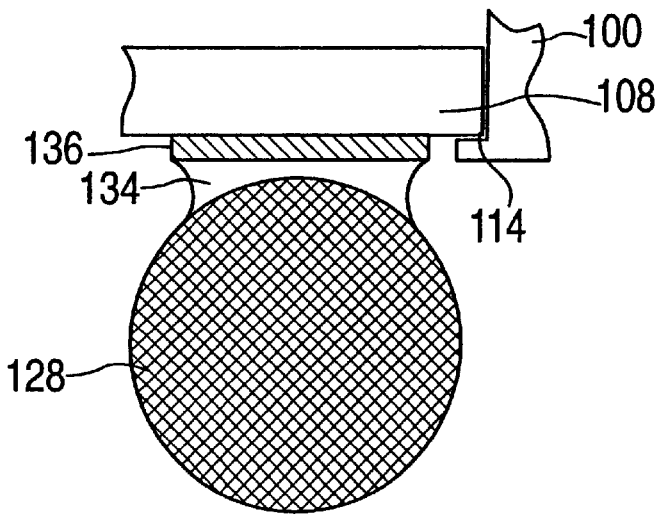
FIG. 5 illustrates the module in FIG. 4 in more detail showing electrical and mechanical connection with a ball interconnect.

Turning to FIG. 5, the electrical connection BGA 128 is conventionally connected to the substrate 108, via lower-melting point solder layer or fillet material 134. Upon heating the substrate 108, in a furnace or oven, the lower-melting point solder layer 134, becomes a molten dispersion or a "liquid" with variable amounts of solid particles, while the solder balls or columns 128, typically remain a solid. This is due to the fact that solder balls 128, are made from materials that have a higher melting point. For the purposes of illustration only the removal of the solder material, such as, a high-melting point solder ball or column 128, (e.g. 90 Pb-10 Sn) and the low-melting point solder fillet material 134, (e.g., eutectic Pb-Sn), will be discussed here. The combination of the low and higher-melting materials together comprise the so-called dual-alloy solder structure.

The substrate 108, having the solder balls or solder columns 128, on a bottom surface 126, is secured to fixture or interchangeable block 100, such that the balls or columns 128, face the wiper blade assembly 98. At this point the wiper blade assembly 98 via the wiper block assembly 68 is retracted against a bias of springs 34 to a first row of BGA 128 to be removed. When wiper block assembly is retracted to first row of BGA 128 to be removed, channel 16 is located below opening 94, wherein solder alloy pin 96 is pushed down to reside in channel 16 and retain wiper block assembly 68 in a retracted position. Fixture or interchangeable module block is configured such that when blade 112 is retracted just past first row of BGA 128 to be removed, that channel 16 aligns with opening 94. It will be appreciated that channel 16 optionally includes a location hole to retain pin 96, and thus wiper block assembly 68, in the retracted position. By disposing solder alloy pin 96 in channel or hole 16, blade 112 is prevented from placing any force on the first row of interconnects until pin 96 is removed or becomes molten. The melting point of solder alloy pin 96 (e.g., 217° C. for Sn/Ag/Cu) is preferably just above a melting point of the BGA fillet material 134 (e.g., 183° C. for eutectic Pb/Sn). In this manner, wiper block assembly 68 will not translate under bias of springs 34 until pin 96 is molten after which all of BGA 128 is molten. It will be appreciated by one skilled in the art that a bimetallic disc may be used to trigger the wiper blade 112 instead of utilization of pin 96.

After wiper block assembly 68 is retracted and retained via pin 96, solder array removal tool 10 is placed in a standard belt furnace and that allows the fillet material to reflow as in the standard BGA joining cycle. As solder alloy pin 96 melts, blade 112 begins a slow translation towards spring adjustment 24 and cleanly wipes off the BGA and fillet, both of which is falls through aperture 22 by action of gravity. The tool 10, also has the capability of adjusting the wiper blade 112 pressure applied to bottom surface 126 of substrate 108. In an exemplary embodiment, blade 112 is a copper blade that conforms around and accounts for any pads 136 that may be above or below substrate surface 126 without damaging the pads 136. The pads 136 form the electrical connection between the BGA 128 (interconnects) and the electrical conductors within module 102. Since wiper block assembly 68 is restricted to translate in a horizontal direction because guide rails 50,52 restrict any vertical translation, pressure applied to bottom surface 126 of substrate 108 is determined by the force applied to interchangeable block 100. The weight of block 100 combined with the minimal weight of module 102 determines the force that wiper blade applies to substrate 108. It will be appreciated that the applied force is optionally increased by including a torque fastener (not shown) on pins 62, 64, such as a threaded fastener for increasing the wiper blade 112 pressure applied to bottom surface 126 of substrate 108. The force applied to the BGA 128 in a horizontal direction is applied by the bias of springs 34. The bias is increased by loosening adjustment 24 and sliding tensioner 30 away from wiper block assembly 68, thus increasing the tension in springs 34 and then tightening adjustment 24. To decrease the bias and hence the applied pressure in the horizontal direction, the tensioner 30 is moved towards wiper block assembly 68. It should be noted that the bias applied by extension springs 34 optionally includes utilization of compression springs, or dash pots. Upon achieving the desired operating temperature, pin 96 becomes molten and can not retain wiper block assembly from translating towards module 102. As the wiper blade 112 moves past module 102, the molten solder of the low-melt alloy 134 and any dispersed solid particles are squeegeed off the I/O pads 136 by squeegee 114, and with it the still solid high-melting point solder ball, or columns 128. It is understood that the molten structure will change from solid to liquid at a predetermined temperature.

In an exemplary embodiment, wiper blade assembly 98 includes a wiper blade 112 is dimensioned having a 0.010 inch thickness and positioned at an angle a to contact bottom surface 126 at approximately a 45 degree angle. After wiper blade 112 wipes away BGA 128 and associated molten fillet material (not shown), squeegee 114 offers a trailing edge wiping clean the pads 136 of residual molten material so that rework may take place next. If necessary, substrate 108 may be dressed before a new BGA is applied. During the solder removal operation it is preferred that the blade 112, first makes contact with the solid solder balls or columns 128, separating them from the molten solder, whereupon they fall away from the substrate 108 or module 102 and exit tool 10 via aperture 22 via gravity. This is followed by the trailing edge or squeegee 114, which wipes the molten solder, that may contain dispersed solid particles off from the substrate 108 or module 102.

After the desired solder populated areas of module 102 or substrate 108, have been squeegeed, the substrate 108 or module 102, is withdrawn from the hot furnace. For most applications it is desired that the exit temperature of the substrate 108 or module 102, should not to exceed 150° C., so as to prevent any oxidation. The part or substrate 108, that has had the solder and/or removed is itself removed from the tool 10, and can then be cleaned. After the solder ball or solder column sites have been cleaned and site dressed the module 102, is now again ready to undergo the same I/O attachment procedure utilized to initially form the solder ball or column structures.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. For example, the above method and apparatus may be employed to remove components on the top side of a module just by reversing the module in the apparatus, or a plurality of wipers may be employed on a fixture for dressing a plurality of substrates. Furthermore, the trigger mechanism is not limited to the meltable solder pin. A variety of trigger mechanisms including bimetallic discs or solder hierarchy structures are optionally employed. Therefore, it is intended that the invention not be limited to the particular embodiment disclosed as the best mode contemplated for carrying out this invention, but that the invention will include all embodiments falling within the scope of the appended claims.

What is claimed is:

1. An interconnection removal apparatus for removing at least one molten or solid structure from a substrate for rework, said removal apparatus comprising:

a fixture for sustaining and biasing the substrate against a wiper assembly, said wiper assembly configured and positioned to slidably engage at least a portion of said substrate;

a bias for translating said wiper assembly along a surface of said substrate having said at least one molten or solid structure to be removed; and a guide block assembly capable of guiding and locking said wiper, wherein said guide block assembly comprises two guide blocks each having a guide block with said wiper assembly intermediate each guide block oriented in parallel to each other, said each guide block including a location pin to locate said fixture.

2. An interconnection removal apparatus for removing at least one molten or solid structure from a substrate for rework, said removal apparatus comprising a fixture for, sustaining and biasing the substrate against a wiper assembly;

said wiper assembly configured and positioned to slidably engage at least a portion of said substrate;

a bias for translating said wiper assembly along a surface of said substrate having said at least one molten or solid structure to be removed; and a guide block assembly capable of guiding and locking said wiper, wherein said guide block assembly includes a base having a channel to releasably lock said wiper assembly.

3. The interconnection removal apparatus in claim 2, wherein said base includes a bias adjustment operably connected to one end of said bias and another end of said bias operably connected with said wiper assembly.

4. The interconnection removal apparatus in claim 2, wherein said wiper assembly depends from a wiper block assembly that is slidably engaged with said guide block assembly.

5. The interconnection removal apparatus in claim 4, wherein said wiper block assembly includes a solid pin to locate in said channel for preventing translation of said wiper block assembly, said pin becomes molten at said temperature thus allowing translation of said wiper block assembly.

6. The interconnection removal apparatus of claim 1, wherein said wiper assembly has a blade to wipe against said at least one solid structure.

7. The interconnection removal apparatus of claim 1, wherein said wiper assembly has at least one trailing edge to so said at least one molten or solid structure from said surface.

8. The interconnection removal apparatus of claim 7, wherein said trailing edge is a high temperature polymer.

9. The interconnection removal apparatus of claim 6, wherein the material for said blade is one of copper and stainless steel.

10. The interconnection removal apparatus of claim 1, wherein said at least one molten or solid structure is selected from the group consisting of low melting point solder, high melting point solder, molten solder which contains disbursed solid particles, eutectic solder, liquid metal, solder balls, solder columns and dual alloy solder.

11. The interconnection removal apparatus of claim 1, wherein said at least one solid structure is at least one solder ball or column.

12. The interconnection removal apparatus of claim 1, wherein said at least one molten or solid structure is at least one molten pad which may contain variable amounts of solid particles.

13. The interconnection removal apparatus of claim 1, wherein said at least one molten or solid structure comprises of at least two materials, wherein at least one first material is a low melting point solder and at least one second material is a high melting point solder.

14. The interconnection removal apparatus of claim 1, wherein said bias comprises one of a tension spring, a compression spring and a bimetallic disc.

15. The interconnection removal apparatus of claim 1, further comprising a heat source to raise the temperature to a melting point level of said at least one molten or solid structure.

* * * * *